United States Patent
Schwager et al.

(10) Patent No.: US 11,270,867 B2
(45) Date of Patent: Mar. 8, 2022

(54) METHOD FOR IMPROVING TRANSMISSION KIKUCHI DIFFRACTION PATTERN

(71) Applicant: Bruker Nano GmbH, Berlin (DE)

(72) Inventors: Thomas Schwager, Berlin (DE); Daniel Radu Goran, Berlin (DE)

(73) Assignee: BRUKER NANO GMBH, Berlin (DE)

( * ) Notice: Subject to any disclaimer, the term of this patent is extended or adjusted under 35 U.S.C. 154(b) by 0 days.

(21) Appl. No.: 17/114,202

(22) Filed: Dec. 7, 2020

(65) Prior Publication Data

US 2021/0183612 A1 Jun. 17, 2021

(30) Foreign Application Priority Data

Dec. 13, 2019 (EP) .................................. 19216196

(51) Int. Cl.
*H01J 37/244* (2006.01)
*H01J 37/20* (2006.01)
*G01N 23/203* (2006.01)

(52) U.S. Cl.
CPC ............ *H01J 37/244* (2013.01); *H01J 37/20* (2013.01); *G01N 23/203* (2013.01); *H01J 2237/20207* (2013.01)

(58) Field of Classification Search
CPC ...... H01J 37/244; H01J 37/20; G01N 23/203; G01N 2223/605; G01N 2223/607;
(Continued)

(56) References Cited

U.S. PATENT DOCUMENTS 6,555,817 B1 4/2003 Rohde et al.
7,442,930 B2 10/2008 Chou
(Continued)

OTHER PUBLICATIONS

Extended European Search Report of corresponding EP 19216196. 6, dated Apr. 6, 2020, 6 pages.

*Primary Examiner* — David A Vanore
(74) *Attorney, Agent, or Firm* — Lewis Roca Rothgerber Christie LLP

(57) ABSTRACT

The present invention refers to a method for improving a Transmission Kikuchi Diffraction, TKD pattern, wherein the method comprises the steps of: Detecting a TKD pattern (20b) of a sample (12) in an electron microscope (60) comprising at least one active electron lens (61) focusing an electron beam (80) in z-direction on a sample (12) positioned in distance D below the electron lens (61), the detected TKD (20b) pattern comprising a plurality of image points $x_D$, $y_D$ and mapping each of the detected image points $x_D$, $y_D$ to an image point of an improved TKD pattern (20a) with the coordinates $x_0$, $y_0$ by using and inverting generalized terms of the form $x_D=\gamma*A+(1-\gamma)*B$ and $y_D=\gamma*C+(1-\gamma)*D$ wherein $$\gamma = \frac{Z}{D}$$

with Z being an extension in the z-direction of a cylindrically symmetric magnetic field $B_Z$ of the electron lens (61), and wherein A, B, C, D are trigonometric expressions depending on the coordinates $x_0$, $y_0$, with B and D defining a rotation around a symmetry axis of the magnetic field $B_Z$, and with A and C defining a combined rotation and contraction operation with respect to the symmetry axis of the magnetic field $B_Z$. The invention further relates to a measurement system, computer program and computer-readable medium for carrying out the method of the invention.

14 Claims, 2 Drawing Sheets

(58) Field of Classification Search
CPC ... G01N 2223/0566; G01N 2223/0565; G01N 2223/401; G01N 2223/102; G01N 2223/071; G01N 23/2055; G01N 23/20058
See application file for complete search history.

(56) References Cited

U.S. PATENT DOCUMENTS

| | | | |
|---|---|---|---|
| 10,319,560 B2* | 6/2019 | Pavia | H01J 37/244 |
| 2015/0369760 A1* | 12/2015 | Penman | G01N 23/203 |
| | | | 250/307 |
| 2016/0178543 A1* | 6/2016 | Schillinger | G01N 23/203 |
| | | | 250/307 |
| 2016/0356729 A1* | 12/2016 | Bauer | H01J 37/252 |
| 2017/0167991 A1* | 6/2017 | Schwager | G01N 23/2252 |
| 2020/0349690 A1* | 11/2020 | Latourte | G06T 5/50 |
| 2021/0025837 A1* | 1/2021 | Goran | H01J 37/256 |
| 2021/0183612 A1* | 6/2021 | Schwager | G01N 23/20058 |

* cited by examiner (A)        21a        (B)        21b

METHOD FOR IMPROVING TRANSMISSION KIKUCHI DIFFRACTION PATTERN

CROSS-REFERENCE TO RELATED APPLICATION(S)

This application claims priority to European Patent Application Number 19216196.6, filed on Dec. 13, 2019, the entire content of which is incorporated herein by reference.

The present invention refers to a method for improving the quality of a Kikuchi pattern obtained using a Transmission Kikuchi Diffraction, TKD, technique. Particularly, an influence of electron optics in an electron microscope used to obtain the TKD pattern shall be reduced. The present invention further relates to a measurement system for performing the method of the present invention as well as to a computer program for performing the method.

TECHNOLOGICAL BACKGROUND AND PRIOR ART

Energy dispersive spectroscopy (EDS, also called EDX) is a commonly used X-ray analytic technique for characterizing the elemental composition of a sample based on characteristic X-rays emitted by the sample after being excited by an incident electron beam. EDS measurements are commonly carried out within electron microscopes (EM), such as e.g., scanning electron microscopes (SEM), which comprise suitably configured EDS detectors inside a measurement chamber of the electron microscope. In the EM, the EDS detectors are often arranged upstream of the sample in the propagation direction of the electron beam.

Another analytic technique for measuring crystal orientation that can be integrated into an electron microscope is Kikuchi diffraction. This technique can be implemented as electron backscatter diffraction (EBSD), which is also known as backscatter Kikuchi diffraction (BKD), or as transmission Kikuchi diffraction (TKD), also known as transmission electron backscatter diffraction (t-EBSD). In EBSD, backscatter electrons are detected from a direction perpendicular to the incident electron beam direction, whereas in TKD transmitted and diffracted electrons are detected with a detector pointing in the direction of the incident beam. Both implementations can be theoretically applied to any crystalline material and provide the absolute crystal orientation and phase information with sub-micron spatial resolution.

In general, Kikuchi diffraction can be utilized to provide information on the phase of a sample-region of a crystalline material, particularly on the crystal structure, such as e.g., body-centered or face-centered cubic, orthorhombic or the like, and the spatial orientation of this crystal structure. Kikuchi diffraction can also reveal information on the strain in a material. In Kikuchi diffraction backscattered or transmitted electrons are diffracted by the periodic atomic lattice within the sample according to the Bragg condition before they exit the sample.

In TKD/EBSD at least part of the scattered electrons exit a sample with an angle-dependent intensity distribution. If this intensity distribution is detected using a two-dimensional detector, a Kikuchi pattern 20 as illustrated in FIG. 1 is recorded as a gnomonic projection on the detector surface. Therein, the position of the incident electron beam on the sample with respect to the detector surface is the so-called pattern center (PC). A typical feature of such Kikuchi patterns is the narrow Diffraction bands 21 with an angular width of two times the Bragg angle of the corresponding diffracting crystal planes. These bands can be considered to be formed by the Kossel cone of the respective crystal plane intersecting with the detector. With an appropriate experimental setup, the Diffraction bands can be approximated to be extending linearly on the detector.

Such detected, linearly extending Diffraction bands can be related to an underlying crystal phase and orientation of the material within the source region. Theoretically, a minimum of three bands is necessary to determine the crystal orientation and phase represented by a given Kikuchi pattern. By individually indexing each band present in a Kikuchi pattern, the crystal phase and orientation at the source position can be unambiguously determined. By scanning a sample with an electron beam and obtaining a Kikuchi pattern for each point of such scanned sample grid, a TKD map can be obtained by analysing each individual pattern.

However, in case of not linearly extending Diffraction bands in the Kikuchi patterns, an erroneous solution for crystal orientation and/or phase or no solution at all might be determined for a data point of the TKD map. The linear extension of a Kikuchi band may be impaired by at least one electronic optic within the electron microscope, particularly by a magnetic lens. Magnetic lenses are deliberately created in certain scanning electron microscopes with the aim to improve the scanning resolution of the electron beam. However, due to such magnetic lens, a residual magnetic field may exist in the SEM chamber that distorts the movements of the electrons. As a result, the electron diffraction patterns measured as TKD patterns can be distorted and comprise non-linear Diffraction bands as illustrated in FIG. 2. As one can see in FIG. 2A, in the absence of a magnetic field an undistorted Kikuchi pattern 20a is obtained that comprises a plurality of straight Diffraction bands 21a. However, in the presence of a magnetic field the same experimental setup and sample will provide a warped Kikuchi pattern 20b with a plurality of curved Diffraction bands 20a as illustrated in FIG. 2B.

It is thus an object of the invention to overcome or reduce at least some of the disadvantages of the prior art and to provide a method for improving the quality of an TKD pattern with respect to warping of the TKD pattern by electron optics, particularly magnetic fields.

DESCRIPTION OF THE INVENTION

The objective of the invention is solved and the disadvantages of the prior art are overcome, at least partially, by the method of claim 1, by the measurement system of claim 12, by the computer program of claim 14 and the computer-readable medium of claim 15. The dependent claims are directed to preferred embodiments of the respective independent claims.

A first aspect of the present invention relates to a method of improving a Transmission Kikuchi Diffraction, TKD, pattern. Therein, the improvement particularly is that of unwarping a detected Kikuchi pattern in order to enable high precision indexing of the Kikuchi pattern. In a first step of the method of the invention thus a TKD pattern of a sample is detected or determined based on detected signals corresponding to the TKD pattern. Therein, the TKD pattern is detected in an electron microscope that comprises at least one active electron lens that is configured for focusing an electron beam on a point on a sample. In other words, the electron microscope is a scanning electron microscope with an active scanning process. In the method of the present invention, the sample is positioned in a distance D below the electron lens, particularly in a vertical distance D. According to the present disclosure, the detected TKD pattern is a two-dimensional map comprising a plurality of image points $x_D$, $y_D$, the index D referring throughout this document to the detected TKD pattern. Further preferred, the detected TKD pattern comprises at least one other value assigned to each of the plurality of image points, such as e.g., a greyscale value or the like. An example of a TKD pattern detected in the method of the invention is illustrated in FIG. 2B.

In another step of the method of the present disclosure each of the image points $x_D$, $y_D$ of the detected TKD pattern is mapped to a corresponding image point of an improved TKD pattern. In other words, the detected TKD pattern is mapped to an improved TKD pattern. Therein, the improved TKD pattern comprises a plurality of image points with the coordinates $x_0$, $y_0$. Therein, the amount of image points of the improved TKD pattern is preferably identical to the amount of image points of the detected TKD pattern. The mapping of each image point of the detected TKD pattern on an image point of the improved TKD pattern is performed by using, i.e., based on, generalized terms of the form $x_D=\gamma*A+(1-\gamma)*B$ and $y_D=\gamma*C+(1-\gamma)*D$. Therein, the terms A, B, C, D denote trigonometric expressions that depend on the coordinates $x_0$, $y_0$ and hence provide a relation between the image points coordinates $x_D$, $y_D$ and $x_0$, $y_0$ for each of the plurality of image points of the detected and improved TKD pattern. In more detail, the inverse of the generalized terms is used. Further, the factor is $$\gamma = \frac{Z}{D},$$

wherein in the previous equation Z denotes an extension, i.e., a spatial extension, in the z-direction of a cylindrically symmetric magnetic field $B_Z$ of the electron lens. As the generalized terms in principal map each of the image points of an improved (undisturbed) TKD pattern onto a corresponding image point of a detected (disturbed) TKD pattern, the method of the invention actually use the inverse of the generalized terms given above.

Particularly, the trigonometric expressions B and D define a rotation around a symmetry axis of the magnetic field $B_Z$ and the trigonometric expressions A and C define a combined rotation and contraction operation with respect to the symmetry axis of the magnetic field $B_Z$. In other words, the improvement of the detected TKD pattern comprises the steps of rotating and/or rotating and contracting the detected TKD pattern, particularly each of the image points of the detected TKD pattern. In other words, each image point $x_0$, $y_0$ of the improved TKD pattern is based on the coordinates of the corresponding image point $x_D$, $y_D$ of the detected TKD pattern that is rotated and/or rotated and contracted to be mapped to the image point $x_0$, $y_0$ of the improved TKD pattern.

The method of the present invention, hence allows to improve a TKD pattern, particularly to unwarp a TKD pattern by removing the influence of an electron lens magnetic field from the TKD pattern by using generalized terms that describe geometrical operations of rotation and/or rotation and contraction without considering an actual magnetic field in the electron microscope. Hence, the method of the invention provides sufficient results of improving a TKD pattern without knowing in detail the magnetic field within an electron microscope. Therein, the generalized terms are derived based on the geometry of the linear TKD setup in the microscope. In other words, using a linear setup for a TKD measurement allows for using the generalized terms.

Further preferred in the method of the present invention, the improved TKD pattern is a TKD pattern for the electron microscope without an active electron lens. In other words, the detected TKD pattern is a TKD pattern that is disturbed by a magnetic field present in the electron microscope due to the activity of the at least one electron lens and the improved TKD pattern is a TKD pattern that is not disturbed by a magnetic field present in the electron microscope due to the activity of the at least one electron lens. Summarized, in the method of the present invention an actually detected TKD pattern is mapped to an improved TKD pattern via the generalized terms or the inverse thereof. In other words, the inverse of the generalized terms can be used to map the detected TKD pattern onto the improved TKD pattern.

In a preferred embodiment of the method of the present disclosure each of the trigonometric expressions A, B, C and D further depend on a factor $$\varphi = \frac{\gamma \omega D}{v_z}$$

wherein $\omega$ denotes the circular frequency of the magnetic field $B_Z$ and wherein $v_z$ denotes the velocity of an electron in the z-direction of the electron beam. These values are easily determined for a given electron microscope by the person skilled in the art and hence the trigonometric expressions are easily calculated. Particularly preferred, the trigonometric expressions A, B, C and D depend solely on the coordinates of the image points and the factor $\varphi$. Hence, no further unknowns are present in the trigonometric expressions A, B, C, D except those variables $x_0$, $y_0$ and $\varphi$. The factor $\varphi$ can be more precisely expressed as $$\varphi = \frac{\gamma \omega D}{v} \sqrt{1 + \frac{r^2}{D^2}}$$

based on that $$v_z^2 = \frac{v^2}{1 + r^2/D^2}$$

with v being the total velocity of the electrons. The prefactor $$\beta = \frac{\gamma \omega D}{v}$$

is a parameter which is constant for a given measurement and which contains both the effect of the magnetic field and of the electron speed. The final expression for the factor $\varphi$ is now $$\varphi = \beta \sqrt{1 + \frac{r^2}{D^2}}.$$

It is the argument of the trigonometric functions within the expressions A, B, C, D. Hence, the improvement of the TKD pattern depends on the distance of the image point to the symmetry axis of the magnetic field $B_Z$, wherein the degree of rotation and/or rotation and contraction increases with the distance of the image point to the symmetry axis of field $B_Z$.

In a further preferred embodiment, the method of the present invention further comprises the step of detecting a calibration TKD pattern of a calibration sample in the electron microscope without an active electron lens. Preferably, in this embodiment the sample is also used as a calibration sample for calibrating the method of the invention. After the calibration, TKD patterns of further samples and/or further measurement points of the sample may be detected in the same electron microscope and subsequently improved by using the outcome of the calibration procedure. According to this embodiment, the calibration TKD pattern comprises a plurality of image points $x_C$, $y_C$ and a plurality of mapping operations are performed on the detected TKD pattern, i.e., on each of the image points $x_D$, $y_D$ using the generalized terms. Therein, each mapping operation is performed with a different set of values for $\gamma$ and $\varphi$, i.e., with a different set of parameters $\gamma$ and $\beta$. Further, for each mapping operation, an output TKD pattern resulting from the mapping operation is compared with the calibration TKD pattern and, based on such comparison, one set of values for $\gamma$ and $\varphi$, i.e., one parameter set $\gamma$ and $\beta$, is determined. The so determined one set of values for $\gamma$ and $\varphi$, i.e., the one parameter set $\gamma$ and $\beta$, is then subsequently used for improving detected TKD patterns of the same electron microscope.

Particularly preferred, the above step of comparison between the calibration TKD pattern with the output TKD pattern of each mapping operation is performed by image correlation of each of the output TKD pattern and the calibration TKD pattern. In other words, the patterns themselves are compared to each other by a pixel-based approach. Methods and algorithms for image correlation, particularly for providing a quantitative score as measure of image correlation, are known to the person skilled in the art. According to this embodiment, the one parameter set is determined as that parameter set providing the highest degree of image correlation, e.g., providing the highest quantitative score for image correlation.

In a further preferred embodiment of the present disclosure, the method of the invention further comprises the step of determining a plurality of diffraction bands from the detected Kikuchi pattern and from a calibration Kikuchi pattern. The diffraction bands are preferably determined using image processing algorithms which are state of the art. The diffraction bands are also preferably determined based on the greyscale values of the image points and a spatial cross-correlation for the greyscale values of neighboring image points.

Further preferred, such Diffraction bands can be advantageously used for the comparison between a calibration TKD pattern and the output TKD pattern of each mapping operation in determining the best set of values for $\gamma$ and $\varphi$, i.e., the best set of parameter set $\gamma$ and $\beta$, as described above. Particularly, according to this embodiment, a plurality of diffraction bands is determined from the detected diffraction pattern, wherein the diffraction bands comprise a plurality of image points $x_D^{DB}$, $y_D^{DB}$. Further, a plurality of corresponding diffraction bands comprising a plurality of image points $x_0^{DB}$, $y_0^{DB}$ is determined from the improved diffraction pattern. Then, the diffraction bands and the corresponding diffraction bands are compared and one parameter set $\gamma$ and $\beta$ providing the best match is determined based on the comparison. This parameter set is then preferably used for determining the improved TKD pattern.

According to a further particularly preferred embodiment, Diffraction bands are determined for each output TKD pattern, i.e., for each TKD pattern mapped from the detected TKD image with a certain defined parameter set. Further, straightness is determined for each of these Diffraction bands. In an undisturbed TKD pattern, the Diffraction bands should always be straight. Hence, any output TKD pattern with not straight Diffraction bands and the corresponding parameter set can be disregarded. Hence, according to this embodiment, for each output TKD pattern, the straightness of Diffraction bands, i.e., a quantitative measure of such straightness, is determined and further the one parameter set is determined providing the output TKD pattern with the straightest Diffraction bands, i.e., the quantitative measure indicating the best straightness of Diffraction bands.

Alternatively or additionally crystal phase information are determined for each output TKD pattern based on the Diffraction bands determined for each of the output TKD pattern. Therein, crystal phase information refers to the type and orientation of a crystal lattice as it is can be determined based on a certain set of Diffraction bands. According to this embodiment, the one parameter set is determined that provides an output TKD pattern, the crystal phase information of which provide the best match with the crystal phase information determined based on the Diffraction bands of the calibration TKD pattern. Therein, a quantitative measure is preferably used for comparing the crystal phase information of the Diffraction bands of the output TKD patterns and the Diffraction bands of the calibration TKD pattern.

In a further preferred embodiment of the present disclosure, the magnetic field, i.e., the cylindrically symmetric magnetic field mentioned above, is presumed as $B=(0, 0, B_Z)$, i.e., as comprising no components at all in the x-direction and in the y-direction. Hence, an ideal linear setup of the electron microscope and the TKD detector is presumed. The origin of the coordinate system used here is centred on the sample, i.e. $z=0$ refers to points directly on the lower sample surface. Further preferred, the magnetic field, i.e., the cylindrical symmetric magnetic field mentioned above, is presumed as $B=B(z)$ with $B=0$ for any $z>Z$, i.e., as being zero for any distance of the sample exceeding the distance Z. In other words, the magnetic field is presumed as $B(r)=B(r)e_z$ and is presumed as $$B(r) = \begin{cases} B_Z \text{ for } z \leq Z \\ 0 \text{ for } z > Z \end{cases}.$$

In other words, the method of the invention is based on the assumption an artificial magnetic field with unrealistic properties, particularly the generalized terms are derived based on this assumption.

The presumed magnetic field is assumed to be uniform, parallel to the z-axis and changing abruptly to zero at a certain distance from the sample. Such a magnetic field does not exist but only serves to motivate the form of the generalized terms. Hence, none of the parameters of the generalized terms has any physical meaning which would allow the description or representation of a real magnetic field, e.g., in the SEM. Further preferred, in the method of the invention it is presumed that $Z<D$, i.e., that the detecting device for the Kikuchi pattern (see below) is positioned in a field-free volume of the SEM chamber.

In a particularly preferred embodiment of the method of the invention, the trigonometric expression A is of the form $$x_0 \frac{\sin \varphi}{\varphi} + y_0 \frac{1 - \cos \varphi}{\varphi},$$

the trigonometric expression B is of the form $x_0 \cos \varphi + y_0 \sin \varphi$, the trigonometric expression C is of the form $$-x_0 \frac{1 - \cos \varphi}{\varphi} + y_0 \frac{\sin \varphi}{\varphi},$$

and the trigonometric expression D is of the form $-x_0 \sin \varphi + y_0 \cos \varphi$. These trigonometric expressions can be derived based on certain assumptions for the geometry of an electron microscope and a linearly setup TKD detector as well as by choosing specific boundary conditions with respect to such setup. However, it is apparent for the skilled person that the assumptions and or the boundary conditions can be varied without necessarily leaving the scope of the present disclosure and its embodiments. However such amendments may lead to different trigonometric expressions which is why the present disclosure should not be limited thereto.

As already set forth above, the factor $\varphi$ can also be expressed as $$\varphi = \frac{\gamma \omega D}{v} \sqrt{1 + \frac{r^2}{D^2}}$$

with r denoting a horizontal distance of an improved image point $x_0$, $y_0$ from the symmetry axis and $v = \sqrt{v_x^2 + v_y^2 + v_z^2}$ denoting the velocity of an electron. Hence, the further away an undisturbed image point of an improved TKD pattern is from the symmetry axis of the magnetic field (usually the position of the electron beam), the smaller the z-component of the electron's velocity is (and hence the larger the velocities in the x- and y-direction are) and hence the larger the actual distortion with respect to this image point is. In other word, the shift between a first improved image point with a first distance from the symmetry axis of a first improved TKD pattern and the corresponding first detected image point of a first detected TKD pattern will exceed the shift of a second improved image point with a second distance from the symmetry axis smaller than the first distance of a second improved TKD pattern and the corresponding second image point of the detected TKD pattern.

With respect to the steps of the method for determining a sample structure that are known from the prior art it is referred to the following documents that give an overview over the state of the art with respect to the generation of EBSD/TKD maps in EBSD or TKD analysis. It is particularly referred to the text book "Electron Backscatter Diffraction in Material Science" by Schwartz A. J. et al, Springer Science, 2000, New York. It is further referred to the review publication of Schwarzer R. A. et al. "Present State of Electron Backscatter Diffraction and Prospective Developments", Oct. 24, 2008, Lawrence Livermore National Laboratory. Insofar admissible, the content of these publications is incorporated herein with respect to the steps of the methods described above, where these steps are known from the prior art. The content is incorporated herein by reference for the sake of sufficiency of disclosure with respect to the steps of the methods of the invention that are already known from the prior art.

Another aspect of the present invention refers to a measurement system comprising an electron microscope, EM, preferably a scanning electron microscope, SEM, with at least one electron lens, a TKD detector that is configured for detecting a TKD pattern of a sample positioned in distance D below the electron lens, and a control unit configured to perform the method for improving a Transmission Kikuchi Diffraction, TKD, pattern according to the invention as described above. The electron microscope preferably further comprises an EDS detector and is further configured for (scanning) electron microscopy/imaging. Further preferred, the TKD detector is configured to perform TKD measurements under control of the control unit. Particularly preferred, the control unit that is further configured to control an electron source, the TKD detector and, eventually, the ESD detector. Further preferred, the electron lens is configured to focus an electron beam in a z-direction onto the sample.

Further preferred the (S)EM is configured to perform TKD measurements in the same configuration as used for with EDS measurements and/or as used for obtaining images with an imaging detector. Further preferred, the imaging detector is an in-column imaging detector that might be arranged inside a pole piece of an electron lens and/or between electron lenses of the column. In-column imaging detectors use secondary electrons (SE) and therefore may be named in-column SE detectors. Preferably, the TKD detector comprises at least an active surface, e.g. phosphor screen for converting incident electrons to photons and a CCD or CMOS camera for obtaining image signals from these photons. Further preferred, the TKD detector comprises a cooling system and is configured for operating at room temperature for reducing the dark current of the CCD/CMOS camera. Further preferred, the TKD detector is a Bruker e-Flash EBSD detector retrofitted for optimal measurement geometry with a Bruker Optimus TKD measuring head used as a sample holder in the EM.

Another aspect of the invention relates to a computer program comprising instructions which, when the program is executed by a computer, e.g. a control unit of the measurement system of the invention, cause the computer, and eventually the measurement system, to carry out the method of the invention, comprising the steps of: detecting a TKD pattern of a sample in an electron microscope comprising at least one active electron lens focusing an electron beam in z-direction on a sample positioned in distance D below the electron lens, the detected TKD pattern comprising a plurality of image points $x_D$, $y_D$; mapping each of the detected image points $x_D$, $y_D$ to an image point of an improved TKD pattern with the coordinates $x_0$, $y_0$ by using generalized terms of the form $x_D = \gamma * A + (1-\gamma) * B$ and $y_D = \gamma * C + (1-\gamma) * D$, wherein $$\gamma = \frac{Z}{D}$$

with Z being an extension in the z-direction of a cylindrically symmetric magnetic field B of the electron lens, and wherein A, B, C, D are trigonometric expressions depending on the coordinates $x_0$, $y_0$, with B and D defining a rotation around a symmetry axis of the magnetic field B, and with A and C defining a combined rotation and contraction operation with respect to the symmetry axis of the magnetic field B.

Another aspect of the invention relates to a computer-readable medium comprising instructions which, when executed by a computer, e.g. a control unit of the measurement system of the invention, cause the computer, and eventually the measurement system, to carry out the method of the invention, comprising the steps of: detecting a TKD pattern of a sample in an electron microscope comprising at least one active electron lens focusing an electron beam in z-direction on a sample positioned in distance D below the electron lens, the detected TKD pattern comprising a plurality of image points $x_D$, $y_D$; mapping each of the detected image points $x_D$, $y_D$ to an image point of an improved TKD pattern with the coordinates $x_0$, $y_0$ by using generalized terms of the form $x_D=\gamma*A+(1-\gamma)*B$ and $y_D=\gamma*C+(1-\gamma)*D$, wherein $$\gamma = \frac{Z}{D}$$

with Z being an extension in the z-direction of a cylindrically symmetric magnetic field B of the electron lens, and wherein A, B, C, D are trigonometric expressions depending on the coordinates $x_0$, $y_0$, with B and D defining a rotation around a symmetry axis of the magnetic field B, and with A and C defining a combined rotation and contraction operation with respect to the symmetry axis of the magnetic field B.

Further aspects and preferred embodiments of the present invention result from the dependent claims, the drawings and the following description of the drawings. Different disclosed embodiments are advantageously combined with each other if not stated otherwise.

DESCRIPTION OF THE DRAWINGS

The features of the invention become apparent to those skilled in the art by the detailed description of exemplary embodiments with reference to the attached drawings in which.

DETAILED DESCRIPTION OF THE INVENTION

Figure 1:
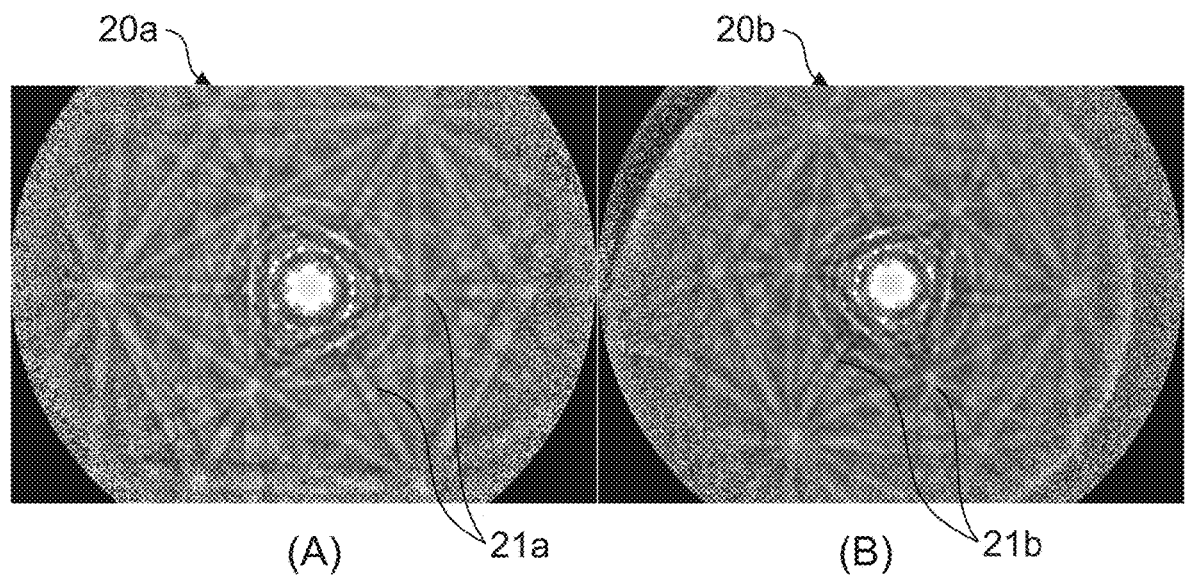
FIG. 1 illustrates the warping of a TKD pattern by a magnetic field of an electron optic.

Reference will now be made in detail to embodiments, examples of which are illustrated in the accompanying drawings. Effects and features of the exemplary embodiments, and implementation methods thereof will be described with reference to the accompanying drawings. In the drawings, like reference numerals denote like elements, and redundant descriptions are omitted. The present invention, however, may be embodied in various different forms, and should not be construed as being limited to only the illustrated embodiments. Rather, these embodiments are provided as examples so that this disclosure will be complete, and will fully convey the features of the present invention to those skilled in the art.

Accordingly, processes, elements, and techniques that are not considered necessary to those having ordinary skill in the art for a complete understanding of the aspects and features of the present invention may not be described. As used herein, the term "and/or" includes any and all combinations of one or more of the associated listed items. Further, in the following description of embodiments the use of "may" when describing embodiments of the present invention refers to "one or more embodiments of the present invention" and terms of a singular form may include plural forms unless the context clearly indicates otherwise.

It will be understood that although the terms "first" and "second" are used to describe various elements, these elements should not be limited by these terms. These terms are only used to distinguish one element from another element. For example, a first element may be named a second element and, similarly, a second element may be named a first element, without departing from the scope of the present invention. Expressions such as "at least one of," when preceding a list of elements, modify the entire list of elements and do not modify the individual elements of the list. The term "substantially", "about," and similar terms are used as terms of approximation and not as terms of degree, and are intended to account for the inherent deviations in measured or calculated values that are recognized by those skilled in the art.

FIG. 1 illustrates the warping of a TKD pattern by a magnetic field of an electron lens. Particularly, FIG. 1A schematically illustrates a TKD pattern 20a that has been obtained in the absence of any magnetic field and hence comprises a plurality of straight Kikuchi lines 21a. The Kikuchi lines 21a have an angular width that corresponds to two times the Bragg angle of the corresponding crystal plane of the crystal lattice reflecting the electrons for producing that band 21. FIG. 1B illustrates a TKD pattern 20b that was obtained in the same experimental setup and for the same measurement point of a sample in the presence of a magnetic field. The so obtained warped TKD pattern 20b comprises a plurality of bent (warped) Diffraction bands 21b. A detection of a similar experimental Kikuchi pattern 20 using Transmission Kikuchi Diffraction, TKD, is described with respect to FIG. 2.

Figure 2:
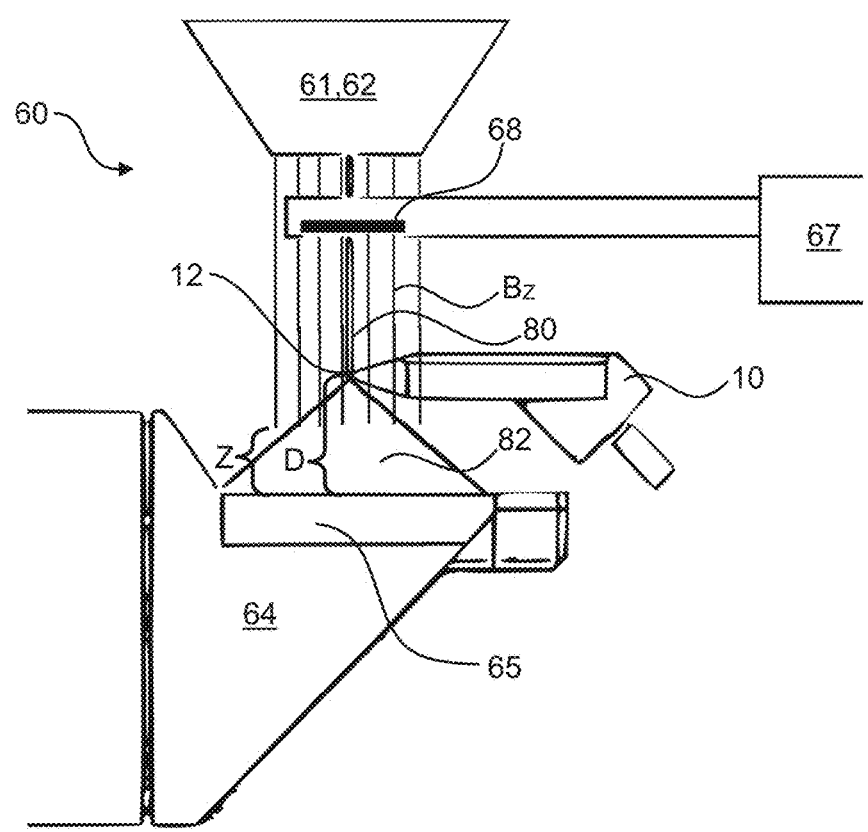
FIG. 2 is a TKD and EDS measurement system according to an example.

FIG. 2 illustrates a combined TKD and EDS measurement system mounted to an electron microscope 60 according to an example of the present invention. According to FIG. 2 an electron microscope, EM, 60, i.e., a scanning electron microscope (SEM), is configured to perform transmission Kikuchi diffraction (TKD) measurements. A pole piece 62, which is part of an electron lens 61 of the EM 60, is arranged at a column of the EM 60. Moreover the EM 60 comprises a sample holder 10 and a TKD detector 64, which comprises a phosphor screen 65. Moreover the EM 60 comprises an EDS (energy dispersive X-ray spectroscopy) detector 67. The EM 60 is configured to perform EDS measurements with the EDS detector 67 and to perform TKD measurements with the TKD detector 64. A sample 12, the TKD detector 64, the EDS detector 67, and the column comprising the electron lenses 61 with the pole piece 62, are arranged in a way, such that TKD measurements and EDS measurements can be made without changing the position of a sample holder 10. Particularly, a sample holder 10 is positioned between the EDS detector 67 and the TKD detector 64 such that a sample 12 loaded to the sample holder 10 is positioned between an active area 68 of the EDS detector 67 and a phosphor screen 65 of the TKD detector 64. Particularly, the sample 12 is positioned between the EDS detector 67 and the TKD detector 64 with respect to the propagation direction of an electron beam 80 emitted by the electron microscope 60, particularly from a pole piece 62 of the EM 60, and focused by magnetic lens 61.

The sample 12 is prepared to be electron transparent such that at least part of the incident electron beam 80 is transmitted through the sample 12 and positioned such that the primary electron beam 80 is incident on the sample 12. Depending mostly on the sample thickness, material make-up and incident electron energy, the incident primary electrons are traversing the sample 12 and hence diffracted electrons 82 exit the sample 12 via an exit surface thereof facing the phosphor screen 65 of the TKD detector 64. These transmitted and diffracted electrons 82 allow for detecting Kikuchi patterns of the sample 12 via the TKD detector 64. The incident primary electron beam 80 also effects the generation of characteristic X-rays of the sample 12. The characteristic X-rays exiting the sample 12 via a top surface propagate towards the active area 68 of EDS detector 67, thus allowing to obtain EDS spectra from the sample 12 and to perform an element composition analysis on the sample 12.

However, due to the electron lens 61 of pole piece 62 employing magnetic fields for scanning the incident electron beam 80 over the sample 12, any TKD pattern obtained by TKD detector 64 is prone to be warped as illustrated in FIG. 1B and hence may not be suitable for providing high precision crystal phase information for the sample 12. Hence, for high precision structure and material analysis of sample 12 based on Kikuchi patterns obtained with TKD detector 64 a method of improving Transmission Kikuchi patterns is required.

Figure 3:
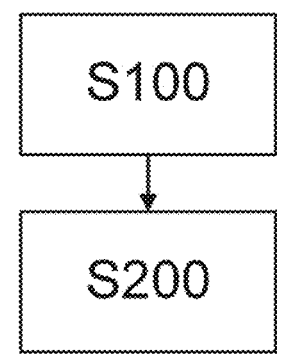
FIG. 3 schematically illustrates the steps performed in the method of the invention.

FIG. 3 schematically illustrates the steps performed in the method of improving Transmission Kikuchi, TKD, patterns according to the present invention.

In a first step S100 of the method of the invention, a TKD pattern of sample 12 is detected in the electron microscope 60 as described already above with respect to FIG. 2. Particularly, the electron lens 61 of EM 60 focusses the electron beam 80 in z-direction on the sample 12 positioned in distance D below the electron lens 61 via the sample holder 10. The diffracted electrons 82 exiting the sample 12 via a rear side thereof facing the TKD detector 64 are detected via the phosphor screen 65 of the TKD detector 64. As set forth above, the detected TKD pattern 20b is distorted by the magnetic field of the electron lens 61 and hence comprises a plurality of warped Diffraction bands 21b as shown in FIG. 1B. Above that the detected Kikuchi pattern comprises a plurality of image points with the coordinates $x_D$ and $y_D$.

In step S200 an improved TKD pattern is calculated based on the TKD pattern detected in step S100. These mapping of the disturbed TKD pattern on the improved (undisturbed) TKD patterns is performed using the generalized terms that are mapping each of the image points $x_0$, $y_0$ of an undisturbed (improved) TKD pattern onto image points $x_D$, $y_D$ of a corresponding detected (disturbed) TKD pattern. In the following the derivation of these generalized terms shall be explained for the measurement as described with respect to FIG. 2, i.e., the linear setup of EM 60 comprising an electron lens 61 that is emitting electron beam 80 onto sample 12 positioned on a z-axis between the electron lens 61 and the phosphor screen 65 of the TKD detector 64.

As already illustrated in FIG. 2, for deriving the generalized terms, a magnetic field of the electron lens is approximated for a reference system with a coordinate system origin being located in the intersection point between the electron beam and the sample. The positive z-direction points downwards, i.e., in the propagation direction of the electron beam, such that the x- and y-directions are positioned in the horizontal plane of the reference system. The origin of the coordinate system is centred on the lower sample surface. In such a system, the magnetic field of the electron microscope is considered to have the form:

$$B(r) = B(r)e_z \quad (1)$$

The magnetic field is thus parallel to the z-direction and is considered to be at least partially constant. Particularly, the field is assumed to be constant until z=Z and to be zero for z>Z:

$$B(r) = \begin{cases} Be_z & \text{for } z \leq Z \\ 0 & \text{elsewhere} \end{cases} \quad (2)$$

A detector for capturing the diffracted electrons in transmission direction is positioned below the sample at position D and thus an electron travels between z-coordinates 0 and D. While travelling in the magnetic field, the so-called Lorentz force is acting on the electron:

$$F = q(v \times B) \quad (3)$$

(with q being the electron charge) and hence the equation of motion of the electron can be written as:

$$0 = \ddot{r} - \frac{q}{m}(\dot{r} \times B) \quad (4)$$

In the magnetic field B(r) as indicated above, the equation of motion simplifies to:

$$0 = \ddot{r} - \frac{qB}{m}(\dot{r} \times e_z) \quad (5)$$

or $$0 = \begin{pmatrix} \ddot{x} \\ \ddot{y} \\ \ddot{z} \end{pmatrix} - \frac{qB}{m} \begin{pmatrix} \dot{y} \\ -\dot{x} \\ 0 \end{pmatrix} \quad (6)$$

It shall be noted that the equation of motion is only presented herein as intermediate step to deriving the generalized terms actually used for improving the TKD patterns in the method of the present invention, particularly using a parameter set based on a calibration pattern. However, no equations of motion are used in the method of the invention.

By introducing the circular frequency ω as given below in (7), the equation (6) can be solved by using the ansatz as defined by equations (8) to (10) below:

$$\omega = \frac{qB}{m} \quad (7)$$

$$\dot{x} = a_x \cos \omega t + b_x \sin \omega t \quad (8)$$

$$\dot{y} = a_y \cos \omega t + b_y \sin \omega t \quad (9)$$

$$\dot{z} = const \quad (10)$$

Using the expressions as given by formulas (8) to (10), the differential equation of formula (6) is reduced to an algebraic system of equations as shown below:

$$0 = \omega(-a_x \sin \omega t + b_x \cos \omega t) - \omega(a_y \cos \omega t + b_y \sin \omega t) \quad (11)$$

$$0 = \omega(-a_y \sin \omega t + b_y \cos \omega t) + \omega(a_x \cos \omega t + b_x \sin \omega t) \quad (12)$$

or, by rearrangement, to a system of equations:

$$0 = -(a_x + b_y)\sin \omega t + (b_x - a_y)\cos \omega t \quad (13)$$

$$0 = -(a_y - b_x)\sin \omega t + (b_y + a_x)\cos \omega t \quad (14)$$

In order to fulfil equations (13) and (14), the bracketed terms before the sine and the bracketed terms before the cosine term have to be equal to zero, respectively. Hence, one finds:

$$b_y = -a_x \quad (15)$$

$$a_y = b_x \quad (16)$$

Thereby, the equations (8) and (9) become:

$$\dot{x} = a_x \cos \omega t + b_x \sin \omega t \quad (17)$$

$$\dot{y} = b_x \cos \omega t - a_x \sin \omega t \quad (18)$$

For the initial time point t=0 one then finds:

$$\dot{x}(0) = v_x \quad (19)$$

$$\dot{y}(0) = v_y \quad (20)$$

$$\dot{z}(0) = v_z \quad (21)$$

Which allows determining the constants in the equations (17) and (18) to:

$$a_x = v_x \quad (22)$$

$$b_x = v_y \quad (23)$$

Hence, the velocity of the electrons in the magnetic field is given by:

$$\dot{x} = v_x \cos \omega t + v_y \sin \omega t \quad (24)$$

$$\dot{y} = -v_x \sin \omega t + v_y \cos \omega t \quad (25)$$

$$\dot{z} = v_z \quad (26)$$

And thus the trajectory of the electron can be found to be:

$$x(t) = A_x + \frac{v_x \sin \omega t}{\omega} - \frac{v_y \cos \omega t}{\omega} \quad (27)$$

$$y(t) = A_y + \frac{v_x \cos \omega t}{\omega} + \frac{v_y \sin \omega t}{\omega} \quad (28)$$

$$z(t) = A_z + v_z t \quad (29)$$

Again it shall be noted that these trajectories are only presented herein as intermediate step to deriving the generalized terms actually used for improving the TKD patterns in the method of the present invention, particularly using a parameter set based on a calibration pattern. However, no trajectories of electrons are used in the method of the invention.

By using the boundary conditions x(0)=0, y(0)=0 and z(0)=0 one can derive that:

$$0 = A_x - \frac{v_y}{\omega} \quad (30)$$

$$0 = A_y + \frac{v_x}{\omega} \quad (31)$$

$$0 = A_z \quad (32)$$

and hence:

$$x(t) = \frac{v_x \sin \omega t}{\omega} + \frac{v_y(1 - \cos \omega t)}{\omega} \quad (33)$$

$$y(t) = -\frac{v_x(1 - \cos \omega t)}{\omega} + \frac{v_y \sin \omega t}{\omega} \quad (34)$$

$$z(t) = v_z(t) \quad (35)$$

At the z-coordinate z=Z, that is at time $T_Z = Z/v_z$ the electron leaves the magnetic field. The respective coordinates and velocities can thus be written as:

$$x(T_Z) = \frac{v_x \sin \omega T_Z}{\omega} + \frac{v_y(1 - \cos \omega T_Z)}{\omega} \quad (36)$$

$$y(T_Z) = -\frac{v_x(1 - \cos \omega T_Z)}{\omega} + \frac{v_y \sin \omega T_Z}{\omega} \quad (37)$$

$$z(T_Z) = Z \quad (38)$$

$$\dot{x}(T_Z) = v_x \cos \omega T_Z + v_y \omega T_Z \quad (39)$$

$$\dot{y}(T_Z) = -v_x \sin \omega T_Z + v_y \cos \omega T_Z \quad (40)$$

$$\dot{z}(T_Z) = v_Z \quad (41)$$

Hence in the field free space the trajectory of the electron becomes:

$$x(t) = x(T_Z) + (t - T_Z)\dot{x}(T_Z) \quad (42)$$

$$y(t) = y(T_Z) + (t - T_Z)\dot{y}(T_Z) \quad (43)$$

$$z(t) = z(T_Z) + (t - T_Z)\dot{z}(T_Z) \quad (44)$$

After inputting the terms for the coordinates and velocities at $T_Z$ one gets:

$$x(t) = \frac{v_x \sin \omega T_Z}{\omega} + \frac{v_y(1 - \cos \omega T_Z)}{\omega} + \quad (45)$$
$$(t - T_Z)(v_x \cos \omega T_Z + v_y \sin \omega T_Z)$$

$$y(t) = -\frac{v_x(1 - \cos \omega T_Z)}{\omega} + \quad (46)$$
$$\frac{v_y \sin \omega T_Z}{\omega} + (t - T_Z)(-v_x \sin \omega T_Z + v_y \cos \omega T_Z)$$

$$z(t) = Z + (t - T_Z)v_z \quad (47)$$

Wherein the last equation simplifies to:

$$z(t) = v_z t \quad (48)$$

At the location z=D, that is at time $T_D = D/v_z$ the electron hits the detector surface. The location of impact on the detector surface can be written as:

$$x(T_D) = \frac{v_x \sin \omega T_Z}{\omega} + \frac{v_y(1-\cos \omega T_Z)}{\omega} + \qquad (49)$$
$$(T_D - T_Z)(v_x \cos \omega T_Z + v_y \sin \omega T_Z)$$

$$y(T_D) = -\frac{v_x(1-\cos \omega T_Z)}{\omega} + \qquad (50)$$
$$\frac{v_y \sin \omega T_Z}{\omega} + (T_D - T_Z)(-v_x \sin \omega T_Z + v_y \cos \omega T_Z)$$

Whereas with a non-existing magnetic field B=0 or $\omega$=0 the location of impact would be:

$$x_0 = x_{\omega=0}(T_D) \qquad (51)$$

$$x_0 = y_{\omega=0}(T_D) \qquad (52)$$

and hence following from the equations (49) and (50) one gets:

$$x_0 = v_x T_D \qquad (53)$$

$$y_0 = v_y T_D \qquad (54)$$

which can be rewritten by inputting $T_D = D/v_z$ into the equations as:

$$x_0 = \frac{D v_x}{v_z} \qquad (55)$$

$$y_0 = \frac{D v_y}{v_z} \qquad (56)$$

These three velocity components are not independent of each other. Particularly, the total velocity takes the value v:

$$v^2 = v_x^2 + v_y^2 + v_z^2 \qquad (57)$$

$$= \frac{v_z^2 x_0^2}{D^2} + \frac{v_z^2 y_0^2}{D^2} + v_z^2 \qquad (58)$$

$$= v_z^2 \left(1 + \frac{x_0^2 + y_0^2}{D^2}\right) \qquad (59)$$

By simplifying $$r^2 = x_0^2 + y_0^2 \qquad (60)$$

One thus gets:

$$v_z^2 = \frac{v^2}{1 + r^2/D^2} \qquad (61)$$

Hence, the further away from the centre the undisturbed image point is, the smaller the z-component of the velocity is and hence the larger the distortion should be.

$$x(T_D) = x_0 \frac{v_z \sin \omega Z/v_z}{\omega D} + y_0 \frac{v_z(1-\cos \omega Z/v_z)}{\omega D} + \qquad (62)$$
$$\frac{D-Z}{D}(x_0 \cos \omega Z/v_z + y_0 \sin \omega Z/v_z)$$

$$y(T_D) = -x_0 \frac{v_z(1-\cos \omega T_Z)}{\omega D} + y_0 \frac{v_z \sin \omega T_Z}{\omega D} + \qquad (63)$$
$$\frac{D-Z}{D}(-x_0 \sin \omega Z/v_z + y_0 \cos \omega Z/v_z)$$

By introducing a mixing parameter $\gamma$ as:

$$Z = \gamma D \qquad (64)$$

One can rewrite the equations (62) and (63) as:

$$x(T_D) = x_0 \frac{v_z \sin \gamma \omega D/v_z}{\omega D} + y_0 \frac{v_z(1-\cos \gamma \omega D/v_z)}{\omega D} + \qquad (65)$$
$$(1-\gamma)(x_0 \cos \gamma \omega D/v_z + y_0 \sin \gamma \omega D/v_z)$$

$$x(T_D) = -x_0 \frac{v_z(1-\cos \gamma \omega D/v_z)}{\omega D} + y_0 \frac{v_z \sin \gamma \omega D/v_z}{\omega D} + \qquad (66)$$
$$(1-\gamma)(-x_0 \sin \gamma \omega D/v_z + y_0 \cos \gamma \omega D/v_z)$$

By denoting the repeated argument of the angular function as $\varphi$:

$$\varphi = \frac{\gamma \omega D}{v_z} \qquad (67)$$

$$= \frac{\gamma \omega D}{v}\sqrt{1 + \frac{r^2}{D^2}} = \beta \sqrt{1 + \frac{r^2}{D^2}} \qquad (68)$$

This introduces the parameter $$\beta = \frac{\gamma \omega D}{v_z}. \qquad (67)$$

The result further simplifies to:

$$x(T_D) = \gamma \left[x_0 \frac{\sin \varphi}{\varphi} + y_0 \frac{1-\cos \varphi}{\varphi}\right] + (1-\gamma)(x_0 \cos \varphi + y_0 \sin \varphi) \qquad (69)$$

$$y(T_D) = \gamma \left[-x_0 \frac{1-\cos \varphi}{\varphi} + y_0 \frac{\sin \varphi}{\varphi}\right] + (1-\gamma)(-x_0 \sin \varphi + y_0 \cos \varphi) \qquad (70)$$

This result can be interpreted as a mixture of a pure rotation defined by the term after factor (1−γ), i.e., terms A and C as defined above, and a more complicated mixture of a rotation and contraction defined by the term after factor γ, i.e., terms B and D as defined above. The angle of rotation is proportional to the magnetic field strength (parameter ω) and the tilt of the electrons (factor $\sqrt{1+r^2/D^2}$). As the term representing the mixed rotation and contraction is divided by φ, the image is contracted more with increasing values of r.

By inputting each of the image points $x_D$, $y_D$ of a detected disturbed TKD pattern (denoted in equations (69) and (70) by $x(T_D)$ and $y(T_D)$, respectively) in the inverse of the equations (69) and (70) as given above, a corresponding image point $x_0$, $y_0$ is determined. By performing this mapping for each image point of the disturbed TKD pattern detected in step S100 in step S200 an improved TKD patterns is calculated.

REFERENCE NUMBERS 10 sample holder
12 sample
20 Kikuchi pattern
21 Kikuchi band
60 EM/SEM
61 electron lens
62 pole piece
64 TKD detector 65 phosphor screen
67 EDS detector
68 active area of EDS detector
80 electron beam
82 transmitted and diffracted electrons (for Kikuchi pattern)

The invention claimed is:

1. Method of improving a Transmission Kikuchi Diffraction, TKD, pattern with the steps:
   Detecting a TKD pattern (20b) of a sample (12) in an electron microscope (60) comprising at least one active electron lens (61) focusing an electron beam (80) in z-direction on the sample (12) positioned in distance D below the electron lens (61), the detected TKD pattern (20b) comprising a plurality of image points $x_D$, $y_D$; and
   Mapping each of the image points $x_D$, $y_D$ to an image point of an improved TKD pattern (20a) with coordinates $x_0$, $y_0$ by using generalized terms of the form $x_D = \gamma \cdot A + (1-\gamma) \cdot B$ and $y_D = \gamma \cdot C + (1-\gamma) \cdot D$,
   wherein $$\gamma = \frac{Z}{D}$$

with L being an extension in the z-direction beyond the sample of a cylindrically symmetric magnetic field $B_Z$ of the electron lens (61), and
   wherein A, B, C, D are trigonometric expressions depending on the coordinates $x_0$, $y_0$, with B and D defining a rotation around a symmetry axis of the magnetic field $B_Z$, and with A and C defining a combined rotation and contraction operation with respect to the symmetry axis of the magnetic field $B_Z$.

2. Method of claim 1, wherein each of the trigonometric expressions A, B, C and D further depend on a parameter β which expresses the strength of the magnetic field $B_Z$ and with v being the velocity of an electron of the electron beam (80).

3. Method of claim 2, further comprising the steps of:
   Detecting a calibration TKD pattern of the sample (12) in the electron microscope (60) without the active electron lens (61), the calibration TKD pattern comprising a plurality of image points $x_C$, $y_C$;
   Performing a plurality of mapping operations on the detected TKD pattern (20b) using the generalized terms, wherein each mapping operation is performed with different set of parameters γ and β;
   Comparing, for each mapping operation, an output TKD pattern with the calibration TKD pattern and determining one parameter set γ and β based on the comparison; and
   Determining the improved TKD pattern (20a) by using the determined parameter set.

4. Method according to claim 3, wherein the comparison is performed by:
   Image correlation of each of the output TKD pattern and the calibration TKD pattern; and
   Determining the one parameter set providing the highest degree of image correlation.

5. Method of claim 1, further comprising the steps of:
   Determining a plurality of diffraction bands (21b) from the detected TKD pattern (20b), the diffraction bands (21b) comprising a plurality of image points $x_D^{KB}$, $y_D^{KB}$;
   Determining, from the improved TKD pattern (20a), a plurality of corresponding diffraction bands comprising a plurality of image points $x_0^{KB}$, $y_0^{KB}$;
   Comparing the diffraction bands and the corresponding diffraction bands;
   Determining one parameter set γ and β based on the comparison; and
   Determining the improved TKD pattern (20a) by using the determined parameter set.

6. Method according to claim 3, wherein the comparison is performed by:
   Determining, for each of the output TKD pattern, a straightness of diffraction bands and determining the one parameter set providing the straightest diffraction bands; or
   Determining crystal phase information for each of the output TKD pattern and the calibration TKD pattern and determining the one parameter set providing crystal phase information matching those of the calibration TKD pattern.

7. Method of claim 1, wherein the magnetic field is presumed as $B = (0, 0, B_Z)$.

8. Method of claim 1, wherein the magnetic field is $B = B(z)$ with $B = 0$ for any $z > Z$.

9. Method of claim 1, wherein $Z < D$.

10. Method of claim 1,
    wherein the trigonometric expression A is of the form $$x_0 \frac{\sin \varphi}{\varphi} + y_0 \frac{1 - \cos \varphi}{\varphi},$$

wherein the trigonometric expression B is of the form $x_0 \cos \varphi + y_0 \sin \varphi$,
wherein the trigonometric expression C is of the form $$-x_0 \frac{1 - \cos \varphi}{\varphi} + y_0 \frac{\sin \varphi}{\varphi},$$

and
wherein the trigonometric expression D is of the form $-x_0 \sin \varphi + y_0 \cos \varphi$.

11. Method of claim 10, wherein φ is expressed as $\varphi =$ $$\varphi = \beta \sqrt{1 + \frac{r^2}{D^2}}$$

with r denoting a horizontal distance of an improved image point $x_o$, $y_o$ from the symmetry axis.

12. Measurement system, comprising a scanning electron microscope, EM, (60), with at least one electron lens (61), a TKD detector (64) configured for detecting a TKD pattern of a sample (12) positioned in distance D below the electron lens (61), and a control unit configured to perform the method for improving a Transmission Kikuchi Diffraction, TKD, pattern according to claim 1.

13. Measurement system of claim 12, wherein the electron lens (61) is configured to focus an electron beam (80) in the z-direction onto the sample (12).

14. A computer-readable medium comprising instructions which, when executed by a computer, cause the computer to carry out the method of claim 1.

* * * * *

UNITED STATES PATENT AND TRADEMARK OFFICE
CERTIFICATE OF CORRECTION

PATENT NO. : 11,270,867 B2
APPLICATION NO. : 17/114202
DATED : March 8, 2022
INVENTOR(S) : Thomas Schwager et al.

Page 1 of 1

It is certified that error appears in the above-identified patent and that said Letters Patent is hereby corrected as shown below:

In the Claims

Column 17, Line 20, Claim 1    Delete "(1-y)" and Insert -- (1-$\gamma$) --
Column 17, Line 20, Claim 1    Delete "(1-y)" and Insert -- (1-$\gamma$) --
Column 17, Line 28, Claim 1    Delete "L" and Insert -- Z --
Column 18, Line 45, Claim 11   After "as" Delete "($\varphi$="

Signed and Sealed this
Sixteenth Day of May, 2023

Katherine Kelly Vidal
*Director of the United States Patent and Trademark Office*